(12) United States Patent
Gan et al.

(10) Patent No.: US 11,742,283 B2
(45) Date of Patent: Aug. 29, 2023

(54) INTEGRATED THIN FILM RESISTOR AND MEMORY DEVICE

(71) Applicant: GLOBALFOUNDRIES Singapore Pte. Ltd., Singapore (SG)

(72) Inventors: Kah Wee Gan, Singapore (SG); Benfu Lin, Singapore (SG); Yun Ling Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 244 days.

(21) Appl. No.: 17/139,117

(22) Filed: Dec. 31, 2020

(65) Prior Publication Data
US 2022/0208675 A1 Jun. 30, 2022

(51) Int. Cl.
| | |
|---|---|
| *H01L 23/522* | (2006.01) |
| *H10B 61/00* | (2023.01) |
| *H10N 50/01* | (2023.01) |
| *H10N 50/80* | (2023.01) |
| *H01L 49/02* | (2006.01) |

(52) U.S. Cl.
CPC .......... *H01L 23/5228* (2013.01); *H01L 28/20* (2013.01); *H10B 61/00* (2023.02); *H10N 50/01* (2023.02); *H10N 50/80* (2023.02)

(58) Field of Classification Search
CPC ... H01L 23/5228; H01L 27/222; H01L 28/20; H01L 43/02; H01L 43/12; H10B 61/00; H10N 50/01; H10N 50/80
See application file for complete search history.

(56) References Cited

U.S. PATENT DOCUMENTS

| | | |
|---|---|---|
| 6,534,374 B2 | 3/2003 | Johnson et al. |
| 6,730,573 B1 | 5/2004 | Ng et al. |
| 7,022,246 B2 | 4/2006 | Chinthakindi et al. |
| 7,323,751 B2 | 1/2008 | Beach et al. |
| 8,445,353 B1 | 5/2013 | Raghavan et al. |
| 8,754,501 B2 | 6/2014 | Khan et al. |
| 9,029,983 B2 | 5/2015 | Chen et al. |
| 9,281,355 B2 | 3/2016 | Dirnecker |
| 9,595,662 B2 | 3/2017 | Li et al. |
| 10,651,236 B2 | 5/2020 | Lee et al. |
| 10,651,373 B2 | 5/2020 | Peng et al. |
| 10,741,748 B2 | 8/2020 | Maniscalco et al. |

(Continued)

FOREIGN PATENT DOCUMENTS

WO 2017155508 9/2017

OTHER PUBLICATIONS

Specification and Drawings for U.S. Appl. No. 17/062,292, filed Oct. 2, 2020, 27 pages.

(Continued)

*Primary Examiner* — Shih Tsun A Chou
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to an integrated thin film resistor with a memory device and methods of manufacture. The structure includes a memory device in back end of line (BEOL) materials and a thin film resistor located in the BEOL materials. The thin film resistor includes electrical resistive material, and an insulator material over the electrical resistive material is thicker than insulator material over the memory device.

19 Claims, 5 Drawing Sheets

(56) References Cited

U.S. PATENT DOCUMENTS

| | | | | |
|---|---|---|---|---|
| 2004/0241951 A1* | 12/2004 | Amadon | ............ | H01C 7/06 |
| | | | | 438/384 |
| 2012/0049997 A1 | 3/2012 | Lim et al. | | |
| 2013/0341759 A1* | 12/2013 | Khan | ............ | H01L 28/24 |
| | | | | 257/533 |
| 2017/0104029 A1* | 4/2017 | Li | ............ | H01L 27/228 |
| 2017/0317143 A1* | 11/2017 | Chen | ............ | H01L 23/5226 |

OTHER PUBLICATIONS

Response to Office Action in U.S. Appl. No. 17/062,292 dated Jul. 11, 2022, 8 pages.
Office Action in U.S. Appl. No. 17/062,292 dated Apr. 11, 2022, 13 pages.
Notice of Allowance dated Sep. 30, 2022 in related U.S. Appl. No. 17/062,292, 9 pages.

* cited by examiner

INTEGRATED THIN FILM RESISTOR AND MEMORY DEVICE

FIELD OF THE INVENTION

The present disclosure relates to semiconductor structures and, more particularly, to an integrated thin film resistor with a memory device and methods of manufacture.

BACKGROUND

A resistor is an electrical component that provides an electrical resistance into an integrated circuit by restricting current that flows through the circuit. A thin film resistor is a resistor that possesses a thin resistive layer, where the thickness of the thin film resistive layer provides different electrical resistive properties.

A thin film resistor in semiconductor systems exhibits, i.e., higher accuracy, low Temperature Coefficient of Resistance (TCR), and its placement can be provided in-between any metal level at the back end of the line (BEOL). The thin film resistor can be integrated with other components of the integrated circuit such as, e.g., metal-insulator-metal capacitors and memory devices. The materials used for these other components, though, can result in many issues including, e.g., warpage of the wafer, alignment issues, etc.

To create a thin film resistor, a dense, uniform metallic alloy film is deposited onto an insulator material layer. The metallic alloy film acts as the electrical resistive layer. After the metallic layer is deposited, it is patterned using photolithography and etching processes, followed by the formation of the electrical contact to the electrical resistive film. In practice, though, the photolithography and etching processes can result in misalignment issues, as well as punch through issues of the electrical resistive layer when the etching process is used to form the electrical contact to the electrical resistive film.

SUMMARY

In an aspect of the disclosure, a structure comprises: a memory device in back end of line (BEOL) materials; and a thin film resistor located in the BEOL materials.

In an aspect of the disclosure, a structure comprises: a memory device comprising at least a bottom electrode and a top electrode in back end of line (BEOL) materials; and a thin film resistor comprising an electrical resistive film, the electrical resistive film being at a same level of the BEOL materials as the bottom electrode of the memory device.

In an aspect of the disclosure, a method comprises: forming a memory device in back end of line (BEOL) materials; and forming a thin film resistor located in the BEOL materials.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
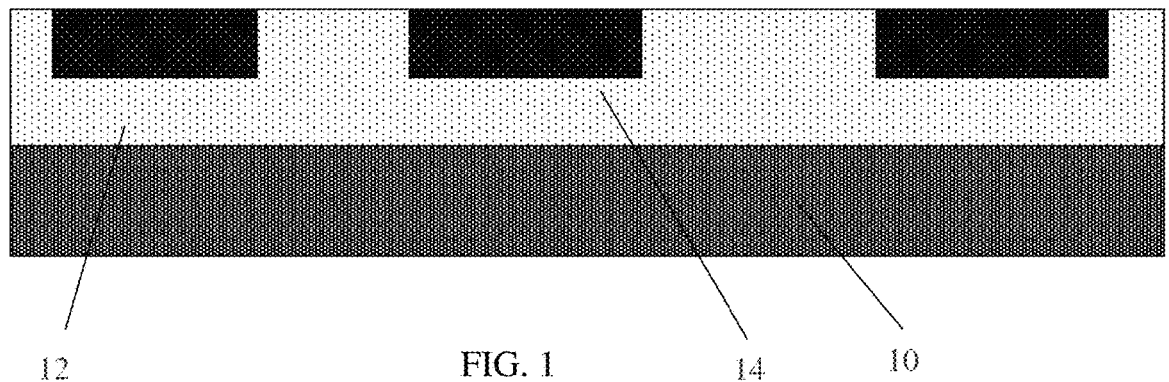
FIG. 1 shows conductive structures, amongst other features, and respective fabrication processes in accordance with aspects of the present disclosure.

The present disclosure relates to semiconductor structures and, more particularly, to an integrated thin film resistor with a memory device and methods of manufacture. More specifically, the present disclosure provides an integration scheme of a thin film resistor with high sheet resistance and low Temperature Coefficient of Resistance (TCR) into a baseline process for a xRAM memory device, e.g., RRAM, MRAM, PCRAM, etc. In this way, and advantageously, the thin film resistor and memory device, e.g., xRAM, can be provided in the same back end of the line (BEOL) materials. Also, the integration scheme will reduce copper out diffusion issues in the thin film resistor.

In embodiments, components (features) of the thin film resistor and memory device, e.g., xRAM, are provided at same levels within the same BEOL layers, e.g., same insulator materials. For example, the bottom contacts of the thin film resistor and memory device, e.g., xRAM, are provided at same levels within the same BEOL layers. In addition, a thin film electrical resistor material of the thin film resistor and a bottom electrode of the memory device are provided within the same BEOL layers. Moreover, contact vias for both the thin film resistor and the memory device are formed in the same BEOL layers, e.g., same insulator materials, and using same conductor material for the contacts.

As to the latter, for example, a first set of contact vias makes contact (e.g., bottom connection) to conductive structures from the underside of a thin film resistor and one contact via makes contact to a top electrode of a memory device (xRAM), all of which are provided through back end of the line (BEOL) layers. In this way, the contact vias can be formed through the same interlevel dielectric material, formed at the same time, and can be filled with the same conductive material for each of the different devices. In embodiments, the thin film resistor can also comprise thicker insulator material over the electrical resistive film, e.g., multiple nitride layers to reduce out diffusion of, e.g., copper, compared to a thinner insulator layer, e.g., single nitride layer, over sidewalls of the xRAM device.

The integrated thin film resistor of the present disclosure can be manufactured in a number of ways using a number of different tools. In general, though, the methodologies and tools are used to form structures with dimensions in the micrometer and nanometer scale. The methodologies, i.e., technologies, employed to manufacture the integrated thin film resistor of the present disclosure have been adopted from integrated circuit (IC) technology. For example, the structures are built on wafers and are realized in films of material patterned by photolithographic processes on the top of a wafer. In particular, the fabrication of the integrated thin film resistor uses three basic building blocks: (i) deposition of thin films of material on a substrate, (ii) applying a patterned mask on top of the films by photolithographic imaging, and (iii) etching the films selectively to the mask.

FIG. 1 shows conductive structures, e.g., wiring structures, in an insulator material, amongst other features, and respective fabrication processes. More specifically, the structure 5 of FIG. 1 includes an insulator material 12 on a substrate 10. In embodiments, the substrate 10 can be any semiconductor material including, e.g., silicon on insulator (SOI) substrates. For example, the substrate 10 may be composed of any suitable material including, but not limited to, Si, SiGe, SiGeC, SiC, GE alloys, GaAs, InAs, InP, and other III/V or II/VI compound semiconductors. The insulator material 12 can be, e.g., oxide. By way of illustrative example, the insulator material 12 can be Tetraethyl orthosilicate (TEOS). The conductive structures 14, e.g., metal or metal alloy structures, can be provided in the insulator material 12. The metal or metal alloy structures 14 can be provided on an underside of both a memory device and thin film resistor as described herein.

The metal or metal alloy structures 14 can be metallization structures formed by conventional lithography, etching and deposition methods known to those of skill in the art. For example, a resist formed over the insulator material 12 is exposed to energy (light) to form a pattern (opening). An etching process with a selective chemistry, e.g., reactive ion etching (RIE), forms one or more trenches in the insulator material 12 through the openings of the resist. Following the resist removal by conventional oxygen ashing process or other known stripants, conductive material can be deposited in the trenches by any conventional deposition processes, e.g., chemical vapor deposition (CVD) processes. In embodiments, the conductive material can be copper. Any residual conductive material on the surface of the insulator material 12 can be removed by conventional chemical mechanical polishing (CMP) processes.

Figure 2:
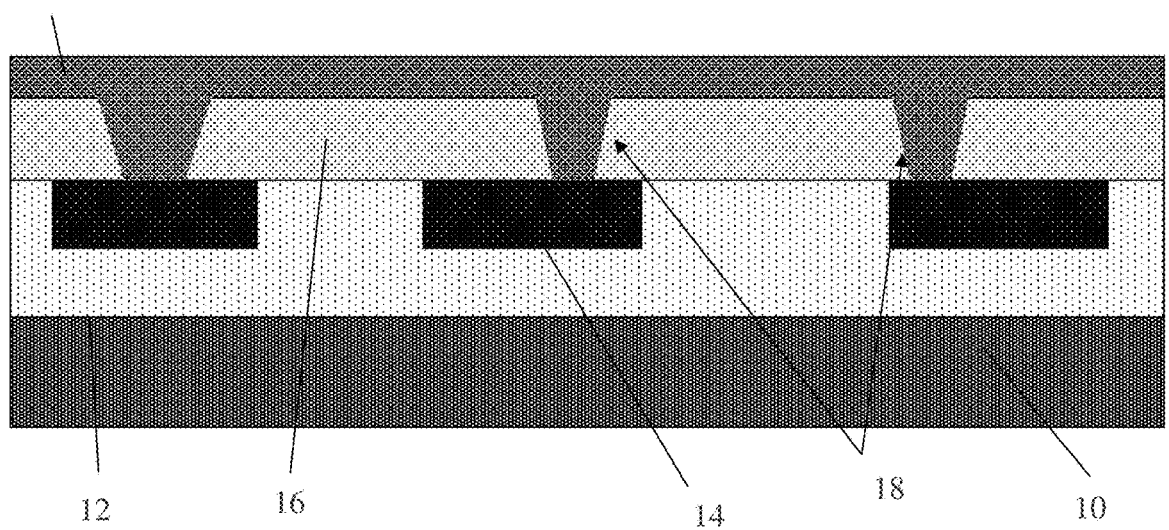
FIG. 2 shows metal material within trenches of an insulator material, amongst other features, and respective fabrication processes in accordance with aspects of the present disclosure.

As shown further in FIG. 2, an insulator material 16 can be formed on the insulator material 12. In embodiments, the insulator material 16 can be SiN deposited by conventional deposition methods such as CVD processes. In embodiments, the insulator material 16 can be deposited to a thickness of 700 Å; although other dimensions are contemplated herein.

Still referring to FIG. 2, trenches 18 are provided in the insulator material 16 to expose the underlying metal or metal alloy structures 14. In embodiments, the trenches 18 can be formed by conventional lithography and etching processes as already described herein such that no further explanation is required for a complete understanding of the present disclosure. Conductive material 20 can be formed within the trenches 18, in contact with the metal or metal alloy structures 14. In embodiments, the conductive material 20 can be, e.g., TaN or other metal or metal alloys, deposited by a sputtering process. For example, the deposition process can be a plasma vapor deposition (PVD) process.

Figure 3:
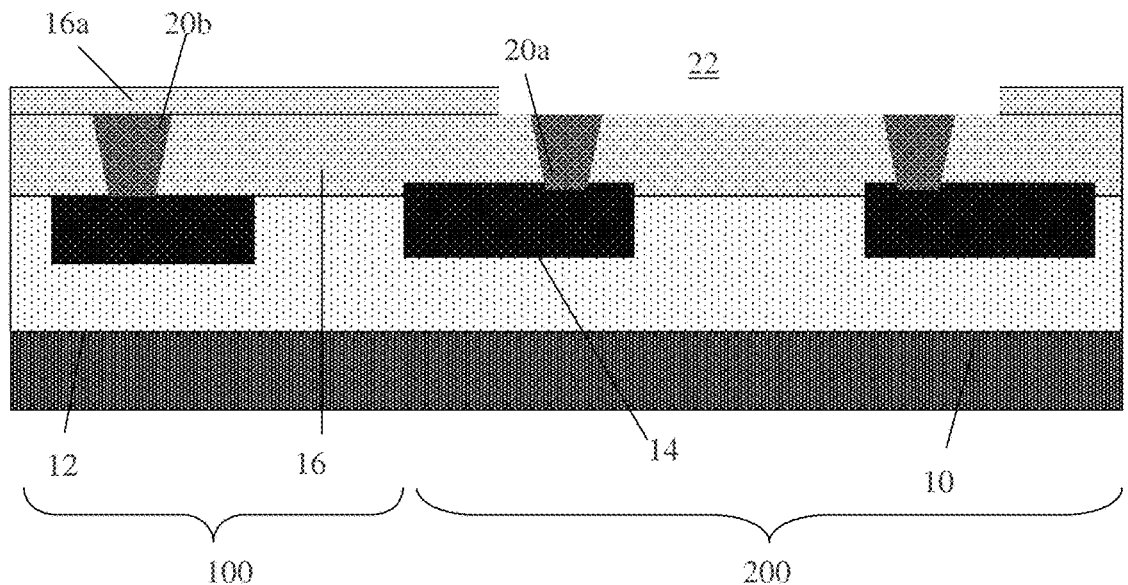
FIG. 3 shows interconnect structures and a recess in the insulator material, amongst other features, and respective fabrication processes in accordance with aspects of the present disclosure.

In FIG. 3, the conductive material 20 is planarized to remove any excess material on a surface of the insulator material 16, thereby forming interconnects 20a, 20b in the same insulator material 16, in direct electrical contact with the underlying metal or metal alloy structures 14 (provided in the same insulator material 12). The interconnects 20b can be contacts for a memory device in a memory region 100 and the interconnects 20a can be contacts to a thin film resistor in a thin film resistor region 200.

Additional insulator material 16a can be formed over the interconnect structures 20a, 20b in the memory region 100 and the thin film resistor region 200. In embodiments, the insulator material 16a can be the same material as the insulator material 16, deposited in a same or similar manner. In this way, the underlying interconnect structure 20b will be buried in the insulator materials 16, 16a. It should be understood that the use of the additional insulator material 16a reduces copper or other metal out diffusion issues in the thin film resistor region 200.

Still referring to FIG. 3, a recess or trench 22 can be formed in the insulator material 16a to expose the interconnect structures 20a in the thin film resistor region 200. The recess or trench 22 allows for the additional fabrication of the thin film resistor at a same level as the memory device, in the BEOL materials. The recess or trench 22 can be formed by a timed etching process.

Figure 4:
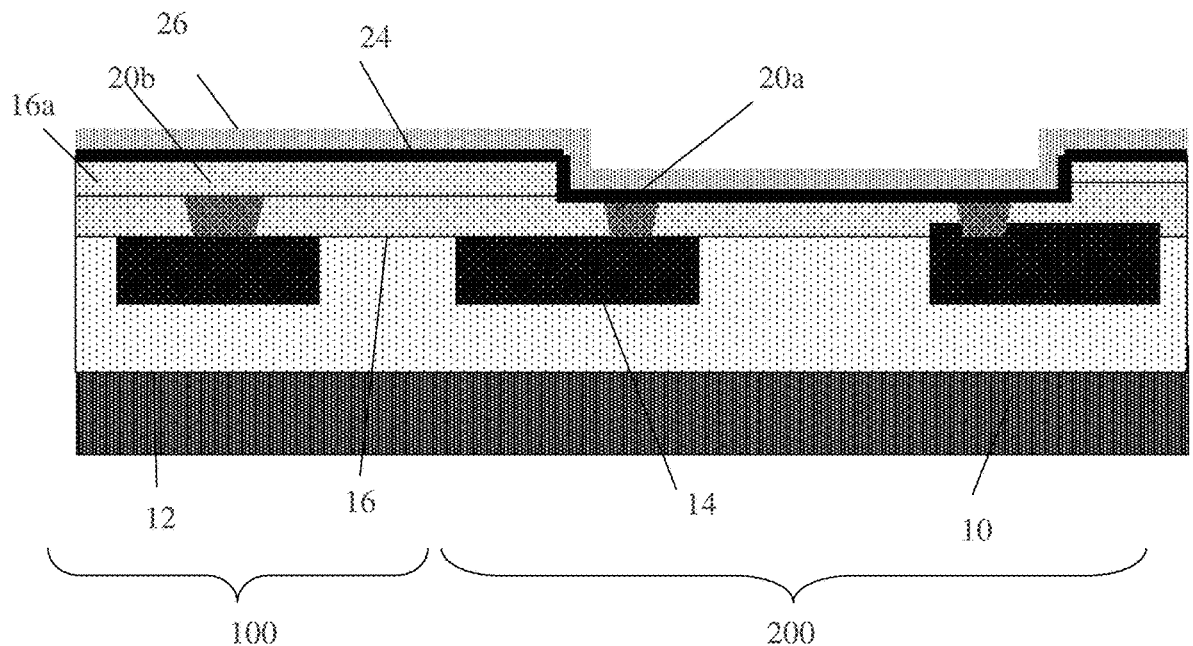
FIG. 4 shows a thin film electrical resistive material within the recess, amongst other features, and respective fabrication processes in accordance with aspects of the present disclosure.

As shown in FIG. 4, a thin film electrical resistor material 24 can be formed, e.g., deposited, within the recess or trench 22 in the thin film resistor region 200 and over the insulator material 16a in the memory region 100. In embodiments, the thin film electrical resistor material 24 contacts the interconnect structures 20a, while the interconnect structure 20b is separated from the thin film electrical resistor material 24 by the insulator material 16a. The thin film electrical resistor material 24 can be deposited to a thickness of about 2 nm to about 20 nm by a sputtering process, e.g., PVD; although other dimensions are contemplated herein depending on the desired electrical resistive values. Also, the thin film electrical resistor material 24 can be conductive material such as, e.g., silicon chromium (SiCr), nickel chromium (NiCr), silicon carbide chromium (SiCCr), tantalum nitride (TaN), tantalum silicon nitride (TaSiN), aluminum-doped nickel chromium (AlNiCr), titanium nickel chromium (TiNiCr), etc. An insulator material 26, e.g., SiN, is formed over the thin film electrical resistor material 24.

Figure 5:
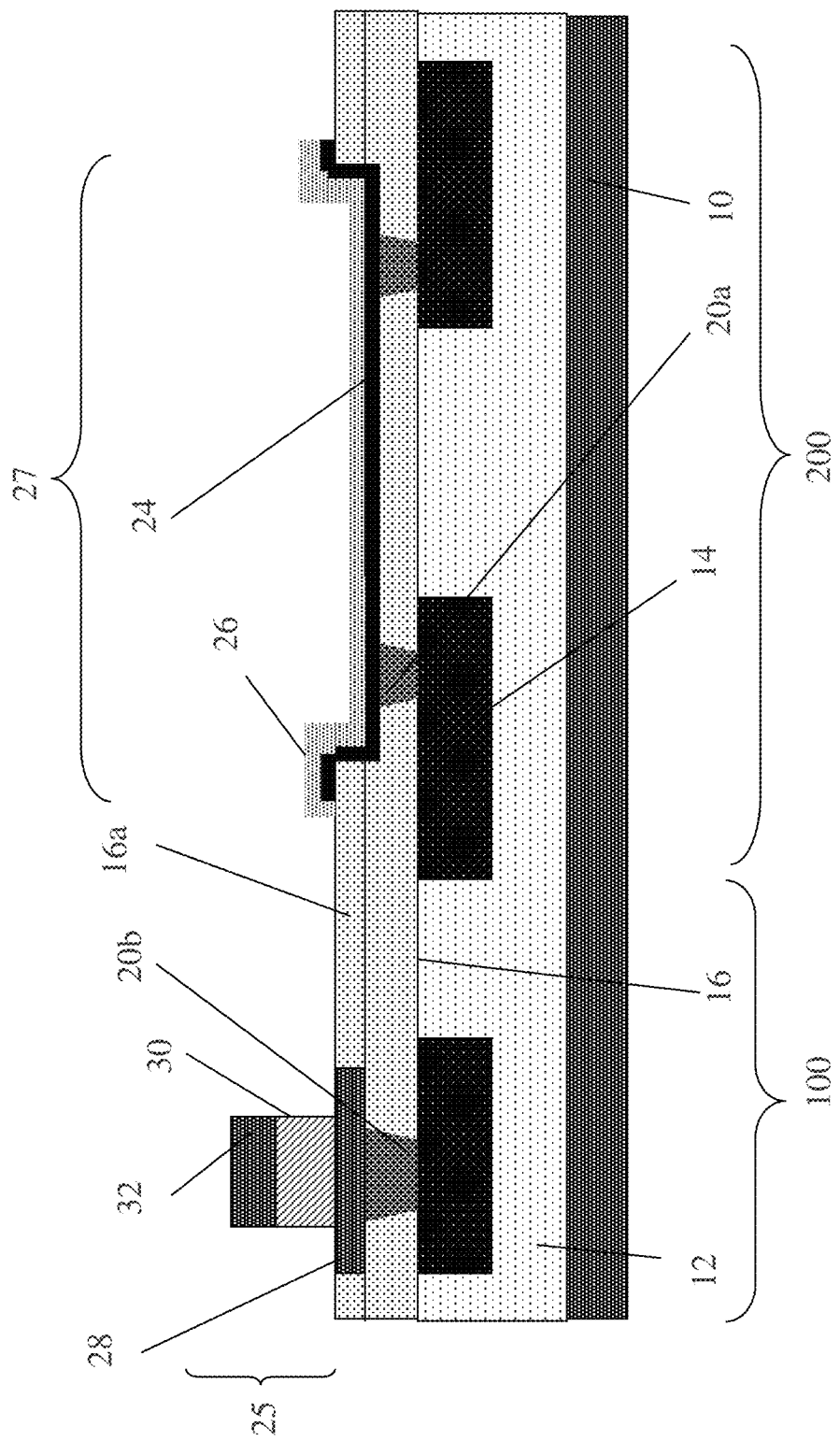
FIG. 5 shows a memory device and thin film resistor, amongst other features, and respective fabrication processes in accordance with aspects of the present disclosure.

FIG. 5 shows a memory device 25 in the memory region 100 and a thin film resistor 27 in the thin film resistor region 200 in the same BEOL layers. Prior to forming the memory device 25, the insulator material 26, e.g., SiN, and the thin film electrical resistor material 24 are patterned in the thin film resistor region 200 using conventional lithography and etching processes. For example, the insulator material 26 and the thin film electrical resistor material 24 can be removed from the memory region 100, while remaining in the thin film resistor region 200 thereby forming the thin film resistor 27.

The memory device 25 includes a bottom electrode 28 formed in the insulator material 16a and in contact with the interconnect structure 20b. In embodiments, the bottom electrode 28 can be formed in a same level, e.g., on top of the insulator material 16, as the thin film electrical resistor material 24 due to, for example, the thin film electrical resistor material 24 being formed in the recess or trench 22. Magnetic tunnel junction (MTJ) materials 30 are formed on the bottom electrode 28, followed by a top electrode 32 formed on the MTJ materials 30. The bottom electrode 28 and the top electrode 32 can be any metal or metal alloy, e.g., tungsten; whereas, the MTJ materials 30 can include a magnetic reference layer, a tunnel barrier layer, and a magnetic free layer. The various material layers of the MTJ materials 30 and top electrode 32 can be formed by utilizing one or more deposition processes such as, for example, plating, sputtering, atomic layer deposition (ALD), CVD, plasma enhanced chemical vapor deposition (PECVD) or PVD, followed by a lithography and etching process to form a stack of materials.

Figure 6:
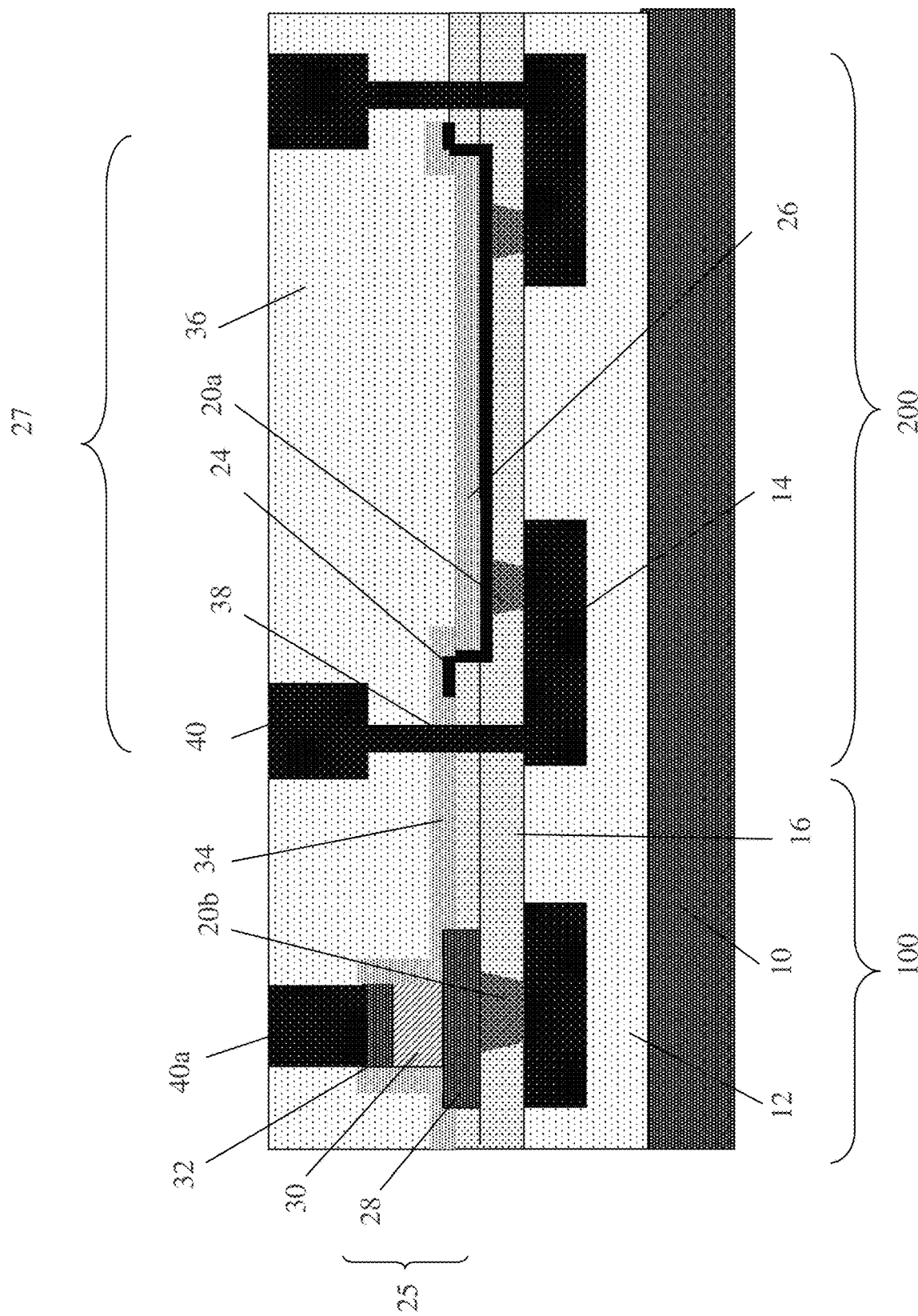
FIG. 6 shows contacts to the memory device and thin film resistor, amongst other features, and respective fabrication processes in accordance with aspects of the present disclosure.

FIG. 6 shows contacts to the memory device 25 and thin film resistor 27 in same back end of line (BEOL) materials, amongst other features. More specifically, in FIG. 6, an insulator material 34 can be formed on the memory device 25 and the thin film resistor 27. The insulator material 34 can be the same material as the insulator material 26. For example, the insulator material 34 can be SiN, deposited by a conventional CVD process. By depositing the insulator material 34, the thin film resistor 27 comprises a thicker layer of insulator materials, e.g., multiple nitride layers, compared to the memory device 25, thereby reducing copper or other metal out diffusion issues.

Following the deposition of the insulator material 34, an interlevel dielectric material 36 can be formed, e.g., deposited, over the memory device 25 and the thin film resistor 27. The interlevel dielectric material 36 can be $SiO_2$ as an example. In further examples, the interlevel dielectric material 36 can be TEOS. Contacts 38 and wiring structures 40 can be formed in contact with the metal or metal alloy structures 14, resulting in underside contacts of the thin film resistor 27; whereas, a wiring structure (or interconnect) 40a can be formed in contact with the top electrode 32 of the memory device 25. The contacts 38 can be electrically isolated (separated) from the thin film electrical resistor material 24 by the insulator materials, e.g., materials 16, 16a, 34.

The contacts 38 and wiring structures 40 of the thin film resistor 27 can be formed by a dual damascene process to form contact vias on the sides of the patterned thin film electrical resistor material 24 (e.g., separated from the thin film electrical resistor material 24). On the other hand, the wiring structure 40a can be formed by a single damascene process to form a contact via over the top electrode 32. Both the damascene processes include etch processes to form vias through the same materials, e.g., interlevel dielectric material 36, with the dual damascene process including an additional etching through the materials 16, 16a to expose the underlying metal or metal alloy structures 14 of the thin film resistor 27. The contact vias are filled with conductive material, e.g., tungsten or aluminum, to form the contacts 38 and wiring structures 40, 40a. Accordingly, the memory device 25 and thin film resistor 27, including the contacts 38 and wiring structures 40, 40a can be fabricated in the same back end of the line (BEOL) layers using many of the same materials and fabrication processes.

Figure 7:
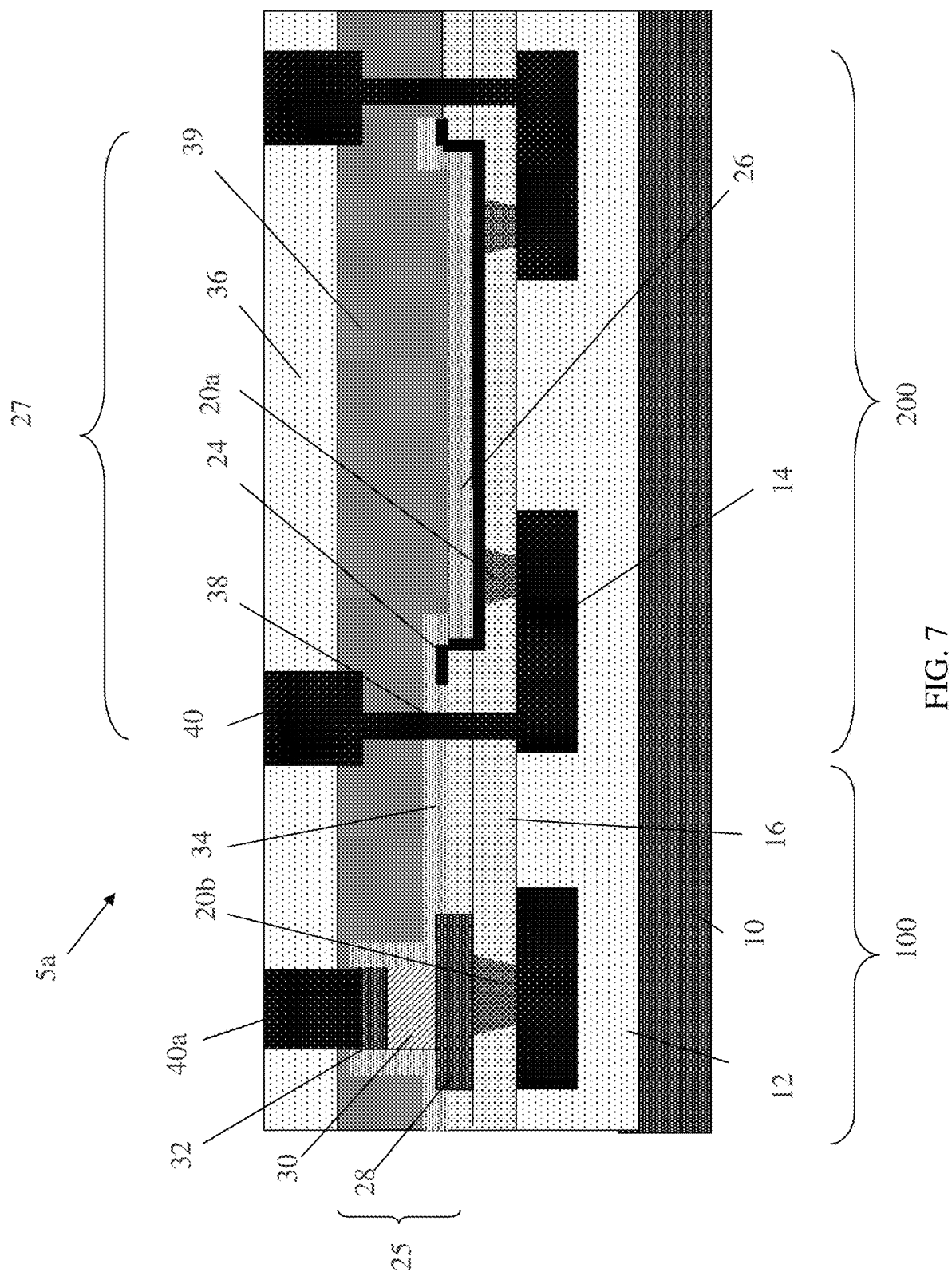
FIG. 7 shows an alternative structure with the memory device and thin film resistor, amongst other features, and respective fabrication processes in accordance with aspects of the present disclosure.

FIG. 7 shows an alternative structure 5a with the memory device 25 and thin film resistor 27. In this alternative structure, the BEOL layer additionally include a spin on glass 39 first formed, e.g., deposited, on the memory device 25 and the thin film resistor 27, followed by the insulator material 34. The contacts 38 and wiring structures 40, 40a are formed through the spin on glass 39 and the insulator material 34, contacting to the underlaying metal or metal alloy structures of the thin film resistor 27 and top electrode 32 of the memory device 25. The remaining features are the same as shown in the structure of FIG. 6.

The integrated thin film resistor can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a memory device in back end of line (BEOL) materials; and
a thin film resistor located in the BEOL materials; and
metallization structures extending on a side of the thin film resistor and contacting the thin film resistor at an underside surface of the thin film resistor,
wherein the metallization structures are in insulator material of the BEOL materials, the metallization structures comprising a first metallization structure which is contacting the thin film resistor from the underside surface and a second metallization structure which is contacting the memory device from an underside.

2. The structure of claim 1, wherein the memory device and the thin film resistor comprise interconnects in a second insulator material of the BEOL materials electrically connecting to the metallization structures, the interconnects further contacting to an electrical resistive material of the thin film resistor and a bottom electrode of the memory device.

3. The structure of claim 2, wherein the electrical resistive material of the thin film resistor and the bottom electrode of the memory device are at a same level of the BEOL materials.

4. The structure of claim 1, further comprising a contact to a top electrode of the memory device and contacts to metallization structures on the underside surface of the thin film resistor, the contacts to the metallization structures on the underside surface of the thin film resistor being on a side of and separated from electrical resistive material of the thin film resistor.

5. The structure of claim 1, wherein:
the memory device comprises a bottom electrode, magnetic tunnel junction (MTJ) materials over the bottom electrode and a top electrode over the MTJ materials; and
the thin film resistor comprises an electrical resistive material on a same level of the BEOL materials as the bottom electrode of the memory device.

6. The structure of claim 5, further comprising conductive structures in a level below the BEOL materials, and the electrical resistive material and the bottom electrode are in electrical contact with the conductive structures.

7. The structure of claim 5, further comprising a first contact connecting to the top electrode and a set of contacts connecting to underlying conductive structures under the thin film resistor.

8. The structure of claim 7, wherein the set of contacts are underside contacts to the thin film resistor which are separated from the electrical resistive material.

9. The structure of claim 7, wherein the first contact and the set of contacts extend through two different insulator materials of the BEOL materials.

10. The structure of claim 1, wherein the thin film resistor comprises electrical resistive material, and an insulator material over the electrical resistive material is thicker than insulator material over the memory device.

11. The structure of claim 10, wherein the memory device comprises the insulator material on sidewalls and the thin film resistor comprises the insulator material on an upper surface of the electrical resistive material.

12. The structure of claim 1, wherein the thin film resistor comprises electrical resistive material formed in a recess of insulator material and on a same level of the BEOL materials as a bottom electrode of the memory device.

13. A structure comprising:
a memory device comprising at least a bottom electrode and a top electrode in back end of line (BEOL) materials;
a thin film resistor comprising an electrical resistive film, the electrical resistive film being at a same level of the BEOL materials as the bottom electrode of the memory device; and
an insulator material on the electrical resistive film and sidewalls of the memory device, the insulator material on the electrical resistive film is thicker than the insulator material on the sidewalls of the memory device.

14. The structure of claim 13, further comprising metallization structures electrically connecting to the bottom electrode of the memory device and the electrical resistive film of the thin film resistor though interconnects, the metallization structures and the interconnects being at a same level and in a same material of the BEOL materials.

15. The structure of claim 13, wherein the electrical resistive film is formed in a recess of insulator material at a same level as the bottom electrode in the insulator material.

16. The structure of claim 13, further comprising a contact electrically connecting to the top electrode of the memory device, and contacts electrically connecting to metallization structures of the thin film resistor, the contacts to the metallization structures of the thin film resistor being on a side and separated from the electrical resistive film.

17. The structure of claim 16, wherein the contacts electrically connecting to the top electrode and to the metallization structures extend through a dielectric material and a spin on glass material.

18. A method comprising:
forming a memory device in back end of line (BEOL) materials;
forming a thin film resistor located in the BEOL materials; and
forming metallization structures on a side of the thin film resistor, the metallization structures contacting the thin film resistor at an underside surface of the thin film resistor,
wherein the metallization structures are in insulator material of the BEOL materials, the metallization structures comprising a first metallization structure which is contacting the thin film resistor from the underside surface and a second metallization structure which is contacting the memory device from an underside.

19. The structure of claim 1, wherein the thin film resistor comprises conductive material comprising a chromium based material.

* * * * *